(12) United States Patent
Suzuki et al.

(10) Patent No.: US 6,469,643 B1
(45) Date of Patent: Oct. 22, 2002

(54) INFORMATION PROCESSING SYSTEM

(75) Inventors: Hiroyuki Suzuki; Masaaki Mitani; Masayoshi Itakura, all of Kawasaki; Akihiko Ogawa, Odawara; Hirotoshi Fujibe, Kobe, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/603,577

(22) Filed: Jun. 26, 2000

(30) Foreign Application Priority Data

Oct. 28, 1999 (JP) .......................................... 11-306904

(51) Int. Cl.$^7$ ................................................ H03M 7/00
(52) U.S. Cl. ......................................... 341/50; 707/536
(58) Field of Search ....................... 341/50, 55

(56) References Cited

U.S. PATENT DOCUMENTS 5,787,452 A * 7/1998 McKenna .................... 707/536
5,793,381 A * 8/1998 Edberg et al. ............... 345/467
6,094,634 A * 7/2000 Yahagi et al. ................ 704/260

FOREIGN PATENT DOCUMENTS

JP           3150668           6/1991

* cited by examiner

Primary Examiner—Howard L. Williams
(74) Attorney, Agent, or Firm—Greer, Burns & Crain, Ltd.

(57) ABSTRACT

An information processing system for normalizing an input character string and storing the normalized character string is provided whereby the required storage capacity can be cut down. Normalizing means normalizes an input character string, for example, "サイクリング同好会", and generates "さいくりんぐ同好会", which is then supplied to restoration information generating means and storing means. The restoration information generating means is supplied also with the original character string "サイクリング同好会", besides the normalized character string "さいくりんぐ同好会", and generates restoration information "F@&" consisting of ASCII characters, which is supplied to storing means. The storing means stores the normalized character string "さいくりんぐ同好会" and the restoration information "F@&" in a manner associated with each other. When the normalized character string "さいくりんぐ同好会" stored in the storing means is specified, restoring means acquires the corresponding restoration information "F@&" and, based on the acquired information, restores the original information "サイクリング同好会". Consequently, the required storage capacity of the storing means can be cut down, compared with the case of storing also the input character string "サイクリング同好会".

6 Claims, 14 Drawing Sheets

| ENTRY | EXAMPLE | CONVERT TO: | ORIGINAL CODE 01 | ORIGINAL CODE 02 | ORIGINAL CODE 03 |
|---|---|---|---|---|---|
| Half-size symbol 1 + numeric character 2000~4000 | # | O | O | Full-size symbol 1 | Full-size numeric character |
| Half-size uppercase alphabetic character 4100~5A00 | A | Half-size lowercase alphabetic character: Original code 01 | Full-size symbol 1 | O | O |
| Half-size symbol 2 5B00~6000 | ¥ | O | O | Full-size symbol 1 | O |
| Half-size lowercase alphabetic character 6100~7A00 | a | O | Half-size uppercase alphabetic character | Full-size uppercase alphabetic character | Full-size lowercase alphabetic character |
| Half-size symbol 3 7B00~7F00 | [ | O | O | Full-size symbol 1 | O |
| Full-size symbol 1 8140~81FC | ? | Half-size symbol 1: Original code 02 | O | O | O |
| Full-size numeric character 824F~8258 | 9 | Half-size numeric character: Original code 03 | O | O | O |
| Full-size uppercase alphabetic character 8260~8279 | A | Half-size lowercase alphabetic character: Original code 02 | O | O | O |
| Full-size lowercase alphabetic character 8281~829A | a | Half-size lowercase alphabetic character: Original code 03 | O | O | O |
| Full-size hiragana character 829F~82F1 | あ | O | Half-size katakana character | Full-size katakana character | O |
| Full-size katakana character 8340~8396 | ア | Full-size hiragana character: Original code 02 | O | O | O |
| Full-size uppercase Greek character 839F~83B6 | Π | Full-size lowercase Greek character: Original code 02 | O | O | O |
| Full-size lowercase Greek character 83BF~83D6 | π | O | O | Full-size uppercase Greek character | O |
| Full-size uppercase Cyrillic character 8440~8460 | Я | Full-size lowercase Cyrillic character: Original code 02 | O | O | O |
| Full-size lowercase Cyrillic character 8470~8491 | я | O | O | Full-size uppercase Cyrillic character | O |
| Full-size line symbol 849F~84BE | ┤ | O | O | O | O |
| Full-size circled numeric character 8740~8753 | ① | O | O | O | O |
| Full-size uppercase Roman numeric character 1 8754~875D | Ⅳ | Full-size lowercase Roman numeric character 1: Original code 02 | O | O | O |
| Full-size unit symbol 875F~8775 | km | O | O | O | O |
| Full-size unit symbol 1-2 8780~879C | √ | Full-size unit symbol 1: Original code 01 | O | O | O |
| Half-size katakana character + symbol A000~DD00 | ア | Full-size hiragana character: Original code 01 | O | O | O |
| Half-size sonant mark & p-sound sign DE00, DF00 | ゛ | Full-size hiragana character: Original code 01 | O | O | O |
| Full-size lowercase Roman numeric character 1 EEEF~EEF8 | iv | O | Full-size lowercase Roman numeric character 2 | Full-size uppercase Roman numeric character 1 | Full-size uppercase Roman numeric character 2 |
| Full-size symbol 2 EEF9~EEFC | ″ | O | O | Full-size symbol 2-2 | O |
| Full-size lowercase Roman numeric character 2 FA40~FA49 | iv | Full-size lowercase Roman numeric character 1: Original code 01 | O | O | O |
| Full-size uppercase Roman numeric character FA4A~FA53 | Ⅳ | Full-size lowercase Roman numeric character 1: Original code 03 | O | O | O |
| Full-size symbol 2-2 FA54~FA57 | ″ | Full-size symbol 2: Original code 02 | O | O | O |

FIG. 5

| SYMBOLIC CHARACTER | MEANING |
|---|---|
| @○ | Succeeding n bytes should be restored by nonconversion |
| _○ | First character should be capitalized and succeeding (n-1) bytes should be restored by nonconversion |
| ? | 1 byte should be restored using identical character |
| ◎ | High-order 3 bits indicate original code, and low-order 5 bits indicate no. of characters to be converted |

FIG. 8

INFORMATION PROCESSING SYSTEM

BACKGROUND OF THE INVENTION

(1) Field of the Invention

The present invention relates to an information processing system, and more particularly, to an information processing system for normalizing an input character string and storing the resulting character string.

(2) Description of the Related Art

Data obtained as a result of the search of a database or the like, for example, is sorted according to predetermined rules before being output. Such rules differ from one OS (Operating System) or DBMS (Data Base Management System) to another, and accordingly, even in cases where search is performed using an identical database, the search results can vary depending upon the system used.

To remove such a system-dependent influence, the inventor hereof previously proposed a method in which original data is normalized, the normalized data and the original data are stored in a database in a manner associated with each other, search and sorting are performed with respect to the normalized data, and the results obtained are converted to the original data and output.

With this method, however, not only the original data but the normalized data need to be stored in the database, giving rise to a problem that the required capacity of the database increases.

SUMMARY OF THE INVENTION

An object of the present invention is to provide an information processing system which permits reduction of the required storage capacity of a database for storing normalized data.

To achieve the above object, there is provided an information processing system for normalizing an input character string and storing a resulting character string. The information processing system comprises normalizing means for generating a normalized character string by normalizing the input character string, restoration information generating means for generating restoration information for restoring the normalized character string obtained by the normalizing means to an original character string, storing means for storing the restoration information generated by the restoration information generating means and the normalized character string in a manner associated with each other, and restoring means, responsive to specification of a certain normalized character string stored in the storing means, for restoring an original character string by looking up the corresponding restoration information.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 5 is a chart illustrating an example of a code conversion table used in the normalization and a restoration process;

FIG. 8 is a chart illustrating, by way of example, conversion symbols constituting restoration information;

DESCRIPTION OF THE PREFERRED EMBODIMENTS

An embodiment of the present invention will be hereinafter described with reference to the drawings.

Figure 1:
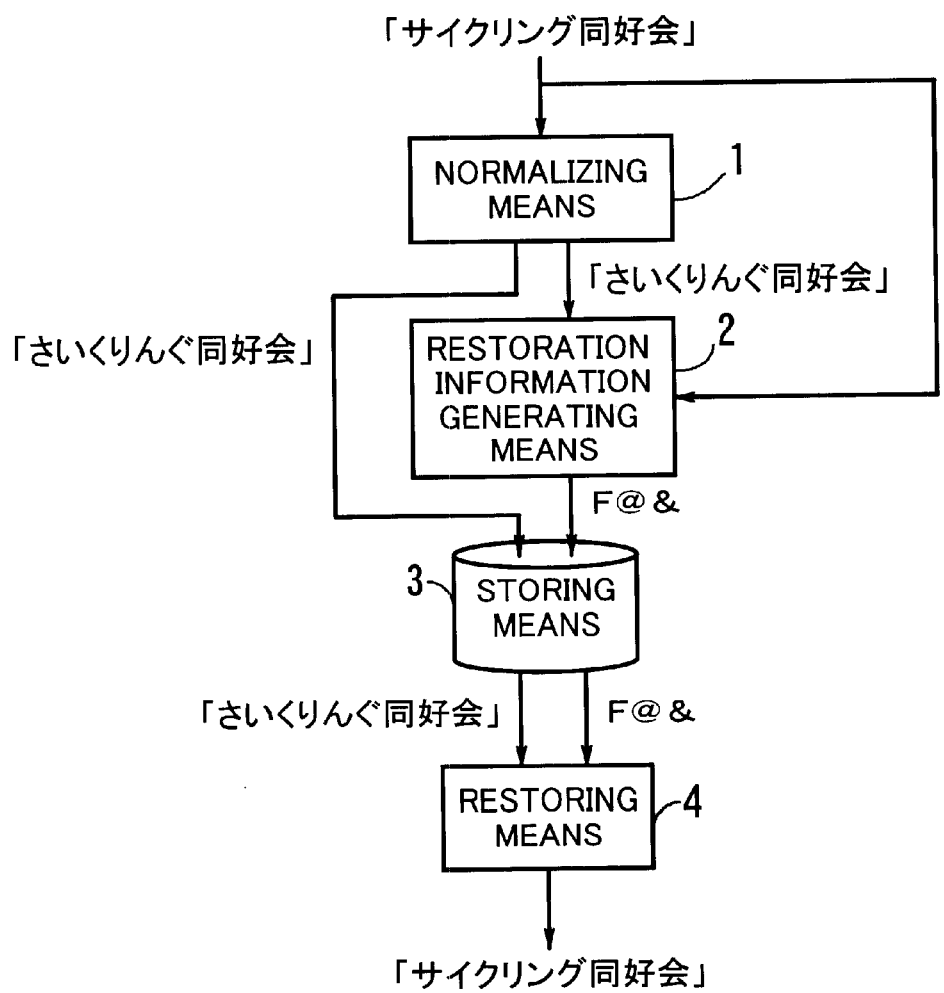
FIG. 1 is a diagram illustrating the principle of operation according to the present invention.

FIG. 1 illustrates the principle of operation according to the present invention. In the figure, normalizing means 1 normalizes a character string input thereto (hereinafter referred to as the input character string) according to predetermined rules and generates a normalized character string.

Restoration information generating means 2 generates restoration information for restoring the normalized character string obtained by the normalizing means 1 to an original character string. If binary code is included in the restoration information, then the restoration information needs to be encoded when it is looked up using HTML (Hyper Text Markup Language), electronic mail, etc. and thus is poor in portability. Accordingly, the restoration information should preferably consist of displayable characters.

Storing means 3 stores the restoration information generated by the restoration information generating means 2 and the normalized character string in a manner associated with each other.

When a certain normalized character string stored in the storing means 3 is specified, restoring means 4 restores an original character string by looking up the corresponding restoration information.

The operation in accordance with the aforementioned principle will be now described.

Assuming that "サイクリング同好会", for example, is input as a character string, the normalizing means 1 normalizes the input character string according to rules. The rules of normalization are given below by way of example.

(1) A full-size katakana character and a half-size katakana character are converted to full-size hiragana counterparts.
(2) A full-size uppercase alphabetic character, a full-size lowercase alphabetic character and a half-size uppercase alphabetic character are all converted to corresponding half-size lowercase alphabetic characters.
(3) A full-size symbol is converted to a corresponding half-size symbol.

Consequently, according to Rule (1), the normalizing means 1 converts "サイクリング" to "さいくりんぐ". For "同好会", there is no applicable rule and thus it is left unchanged. Accordingly, the normalized character string "さいくりんぐ同好会" is output from the normalizing means 1 and supplied to the restoration information generating means 2.

The restoration information generating means 2 generates restoration information based on the normalized character string "さいくりんぐ同好会" supplied from the normalizing means 1 and the input character stringing "サイクリング同好会". The restoration information is generated separately for the case where the character type remains unchanged when normalized and for the case where the character type changes due to the normalization.

Where the character type changes, 1-byte restoration information is generated which is a combination of high-order 3-bit information specifying the character types before and after the normalization and low-order 5-bit information indicating the number of consecutive characters to be converted.

In the case where the character type remains unchanged and at the same time the number of bytes of consecutive characters is 1 byte, the half-size character "?" is used as the restoration information.

On the other hand, where the number of bytes of consecutive characters is 2 bytes or more, 2-character restoration information is generated which consists of the half-size character "@" and an ASCII character corresponding to a sum of the number n of bytes of the consecutive characters and "20h" (h denotes hexadecimal notation).

Where an English-language sentence of which the first letter is capitalized is to be stored as a special case, 2-character restoration information is generated which consists of the half-size character "_" and an ASCII character corresponding to a sum of the number n of bytes of consecutive characters and "20h".

For "サイクリング" in "サイクリング同好会", the character type is normalized from full-size katakana to full-size hiragana. Accordingly, provided that the high-order 3-bit information specifying the character types before and after the normalization is "010", "01000110" is generated by appending the low-order bits "00110" corresponding to the number of the consecutive characters, "6", to the 3-bit information. The generated value corresponds to "46h" in hexadecimal notation, and its corresponding ASCII character is "F".

As for "同好会", it is not converted, and therefore, "@&" is generated as the restoration information by appending the ASCII character "&", which corresponds to the sum "26h" of the number of bytes of the consecutive characters, "6", and "20h", to "@" indicating nonconversion.

Consequently, "F@&" is obtained as the restoration information for the normalized character string "さいくりんぐ同好会", and thus the storing means 3 stores the obtained restoration information "F@&" and the normalized character string "さいくりんぐ同好会" in a manner associated with each other.

With the information stored in this manner, if the normalized character string "さいくりんぐ同好会" stored in the storing means 3 is specified (e.g., in a retrieval process), the restoring means 4 acquires the normalized character string "さいくりんぐ同好会" and its corresponding restoration information "F@&" from the storing means 3.

Then, a process reverse to the above-described process is performed, whereby the input character string "サイクリング同好会" is obtained.

Specifically, first, the restoring means 4 extracts the first character "F" in the restoration information. The character "F" is the information whose high-order 3 bits ("010") specify the character types before and after the conversion and whose low-order 5 bits ("00110") indicate the number of consecutive characters, as mentioned above. Accordingly, by looking up the information, the restoring means 4 converts "さいくりんぐ", to "サイクリング", and copies the converted character string to a restored character string.

Subsequently, the restoring means 4 extracts the character "@". Since the character "@" is stored along with information indicating the number of bytes of consecutive characters, the restoring means 4 acquires the succeeding character "&". The ASCII code of this character is "26h", and therefore, "6" bytes of information, that is, "同好会", "6" being obtained by subtracting "20h" from "26h", are extracted from the normalized information and appended to the restored character string.

As a result, "サイクリング同好会" is obtained as the restored character string.

As described above, according to the present invention, only a normalized character string and restoration information, which are generated from an input character string, are stored, and when the original input character string is needed, it is generated based on the normalized character string and the restoration information. This allows the restoration information, which is shorter in data length than the input character string, to be stored instead of the input character string, whereby the required storage capacity can be reduced.

Specifically, in the aforementioned example, the input character string "サイクリング同好会" consists of a total of 18 bytes of information while the restoration information "F@&" consists of a total of 3 bytes, and it is therefore possible to cut down 15 bytes of information.

Figure 2:
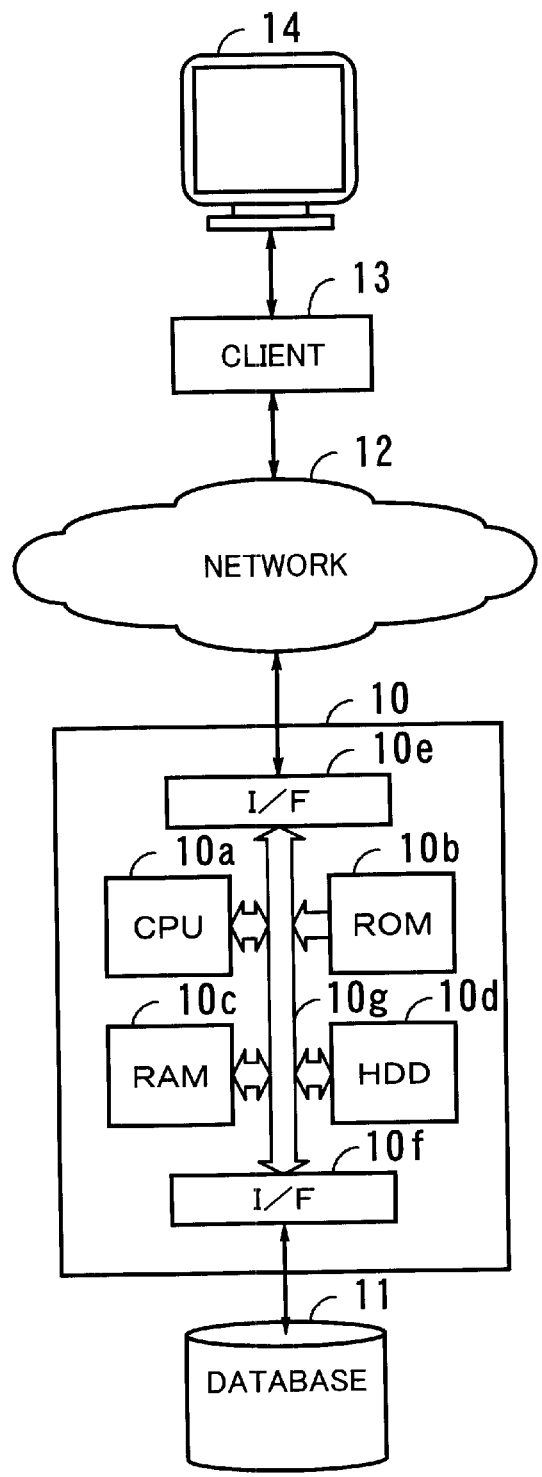
FIG. 2 is a block diagram showing an example of configuration according to an embodiment of the present invention.

FIG. 2 shows an example of configuration according to the embodiment of the present invention. In FIG. 2, when an information processing system 10 according to the present invention is requested to register a character string input from a client 13 (or some other client, not shown) connected thereto via a network 12, it generates a normalized character string by normalizing the input character string supplied thereto, also generates restoration information for restoring the normalized character string to the original information, and registers the normalized character string and the restoration information in a manner associated with each other. Also, when information retrieval is requested from the client 13 (or some other client, not shown), the information processing system searches for an applicable normalized character string, restores the obtained normalized character string by looking up the corresponding restoration information, and transmits the restored character string to the client 13 which has made the request.

A database 11 stores normalized character strings and their corresponding restoration information in a manner associated with each other.

The network 12 is, for example, the Internet.

The client 13 comprises, for example, a personal computer or the like and makes a request via the network 12 to the information processing system 10 to register or search for a specified character string.

A display device 14, which is a CRT (Cathode Ray Tube) monitor or the like, for example, displays the information supplied from the client 13.

The information processing system 10 comprises a CPU (Central Processing Unit) 10a, a RON (Read Only Memory) 10b, a RAM (Random Access Memory) 10c, an HDD (Hard Disk Drive) 10d, I/Fs (Interfaces) 10e and 10f, and a bus 10g.

The CPU 10a controls the individual sections of the system and also performs various computations in accordance with an application program etc. stored in the HDD 10d.

The ROM 10b stores basic programs executed by the CPU 10a, data and the like.

The RAM 10c temporarily stores programs according to which the CPU 10a performs computation, as well as data derived in the middle of computation.

The HDD 10d stores various application programs executed by the CPU 10a, data, etc.

The I/F 10e performs suitable conversion of the form of representation etc. between data on the network 12 and data in the information processing system 10, to permit exchange of data with the network 12.

The I/F 10f converts the form of representation of data etc. when exchanging data with the database 11.

The bus 10g interconnects the CPU 10a, the ROM 10b, the RAM 10c, the HDD 10d and the I/Fs 10e and 10f, to permit exchange of data between these elements.

In the illustrated configuration of the embodiment, the client 13 is connected via the network 12 for exchange of information, but an input device such as a keyboard or the like may be connected to the information processing system 10 so that information can be exchanged directly.

The operation of the above embodiment will be now described.

Figure 3:
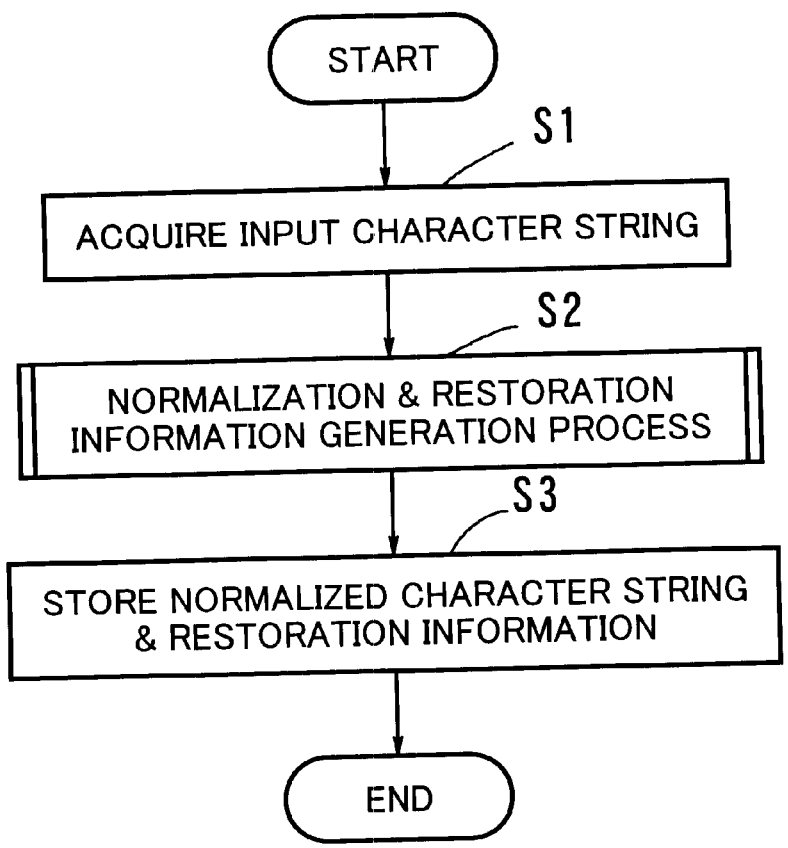
FIG. 3 is a flowchart illustrating an example of a process executed when data is registered in a database in the embodiment shown in FIG. 2.

First, a process of registering input information from the client 13 in the database 11 will be explained. FIG. 3 is a flowchart illustrating the process. Upon start of the process, the following steps are executed.

[S1] The CPU 10a of the information processing system 10 acquires an input character string input from the client 13 and transmitted over the network 12.

Assuming that "ＳＳＮニュース", for example, has been input from the client 13, the information processing system 10 acquires the character string "ＳＳＮニュース" as the input character string.

[S2] The CPU 10a of the information processing system 10 generates a normalized character string by normalizing the acquired character string, and also generates restoration information for restoring the normalized character string. Details of this process will be described later with reference to FIG. 4.

In this example, "ＳＳＮニュース" is normalized and thus "ssn にゅーす" is generated. Also, "CD" is generated as the restoration information.

[S3] The CPU 10a of the information processing system 10 stores the normalized character string and the restoration information in the database 11 in a manner associated with each other.

In this example, "ssn にゅーす" and "CD" are stored in the database 11 in a manner associated with each other.

Figure 4:
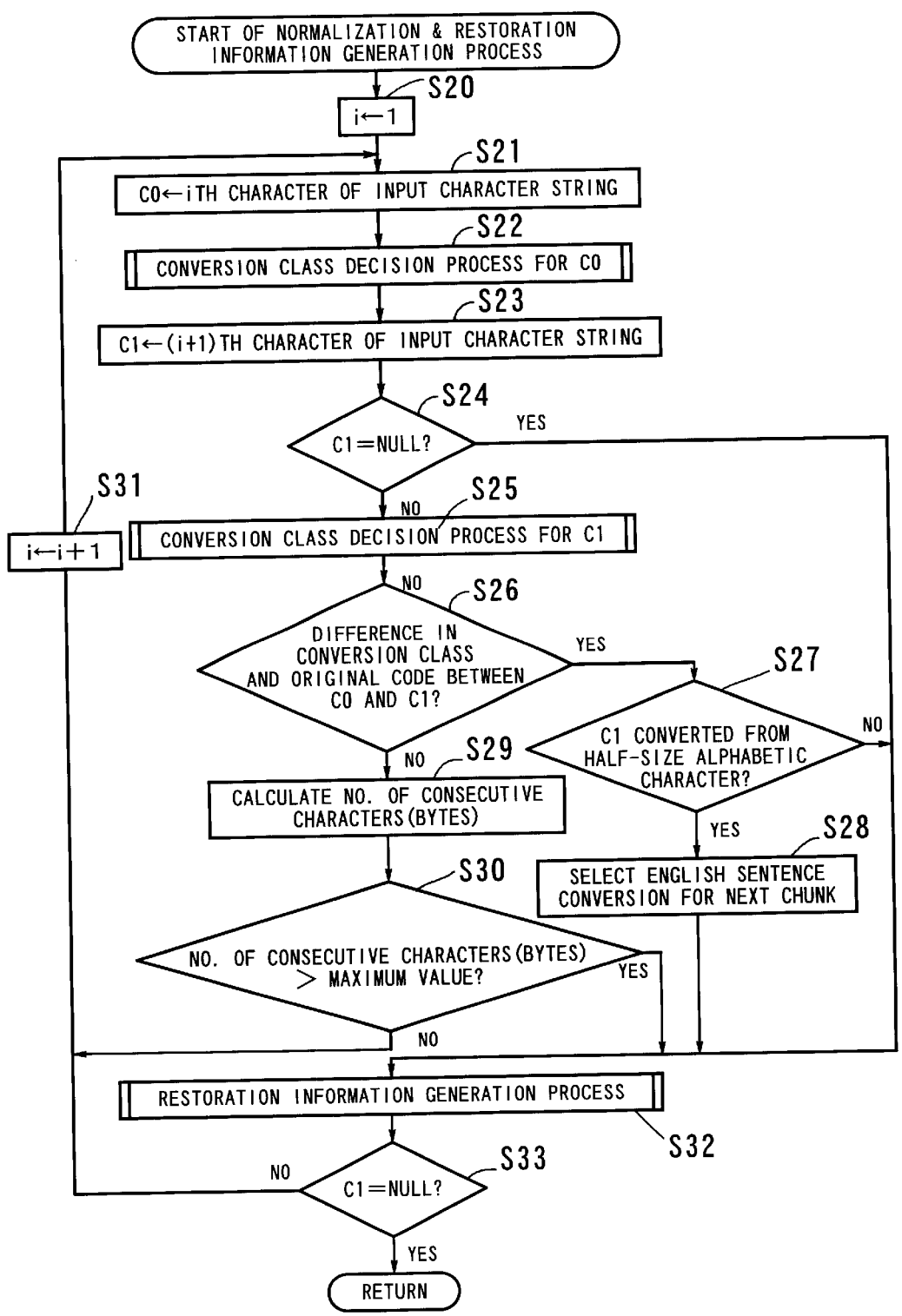
FIG. 4 is a flowchart illustrating details of a "NORMALIZATION AND RESTORATION INFORMATION GENERATION PROCESS" appearing in FIG. 3.

FIG. 4 is a flowchart showing details of the "NORMALIZATION AND RESTORATION INFORMATION GENERATION PROCESS" appearing in FIG. 3. Prior to the explanation of the flowchart, the normalization process according to this embodiment will be described in detail with reference to FIG. 5.

FIG. 5 shows an example of a code conversion table summarizing rules applied during the normalization process. In FIG. 5, "ENTRY" is a part which is searched when a character is normalized and which lists the character types usable in the system. The numbers shown below each entry indicate the Shift-JIS codes of the corresponding entry.

"EXAMPLE" to the right of each entry shows an example of the corresponding entry. For example, "A" is shown as an example of a half-size uppercase alphabetic character.

In "CONVERT TO:" to the right of "EXAMPLE" are shown the character type, if applicable, to which the corresponding entry is normalized, along with an original code (described later). In the case of the second item "half-size uppercase alphabetic character", for example, "CONVERT TO:" indicates that the entry should be converted to a corresponding "half-size lowercase alphabetic character" and that the original code is "01". If the entry is to be left unconverted, "0" is stored.

Original codes "01" to "03" to the right of "CONVERT TO:" are information specifying the origin of conversion. For example, in the case of the fourth item "half-size lowercase alphabetic character", the three character types "half-size uppercase alphabetic character", "full-size uppercase alphabetic character" and "full-size lowercase alphabetic character" can be the origin of conversion, and information necessary for specifying the origin of conversion is given under "01 to "03". Specifically, in the case where the half-size lowercase alphabetic character "a" is included in the normalized character string, it is unknown whether this character was converted from the half-size uppercase alphabetic character "A", the full-size uppercase alphabetic character "A" or the full-size lowercase alphabetic character "a", and the original code provides information specifying the character type to be restored to. For example, "02" shows that the character was converted from the full-size uppercase alphabetic character "A". "0" indicates that there is no applicable origin of conversion.

The illustrated table, which is simplified by way of example, shows the correspondence between each character type and the applicable character type to be converted to, etc., but a table showing the correspondence between each character and the applicable character to be converted to, etc. may be used instead.

The operation shown in the flowchart of FIG. 4 will be now described.

Upon start of the process shown in the flowchart, the following steps are executed.

[S20] The CPU 10a of the information processing system 10 sets a variable i, which is used to count the number of times the process is executed, to the initial value "1".

[S21] The CPU 10a of the information processing system 10 substitutes the ith character of the input character string for a variable C0.

In the case of the aforementioned "ＳＳＮニュース", for example, i=1 in the first cycle of the process, and accordingly, the first character "Ｓ" is substituted for the variable C0.

[S22] The CPU 10a of the information processing system 10 performs a conversion class decision process for the variable C0. The conversion class is classified into the following four classes:

(1) Half-size Nonconversion (example: a→a)
(2) Full-size Nonconversion (example: あ→あ)
(3) Half-size Conversion (example: A→a)
(4) Full-size Conversion (example: A→a)

In the case of "S", for example, (4) applies and thus the applicable conversion class is "Full-size Conversion".

Details of this process will be described later with reference to FIG. 6.

[S23] The CPU $10a$ of the information processing system 10 substitutes the (i+1)th character of the input character string for a variable C1.

For example, in the case of the aforementioned "ＳＳＮニュース", (i=1)=2 in the first cycle of the process, and accordingly, the second character "S" is substituted for the variable C1.

[S24] The CPU $10a$ of the information processing system 10 determines whether or not the variable C1 is NULL (empty). If the variable is NULL, the flow proceeds to Step S32; if not, the flow proceeds to Step S25.

Specifically, if the variable C1 is NULL, then it means that the variable C0 stores the last character of the input character string; in this case, the flow proceeds to a restoration information generation process in Step S32.

In the above example, "S" is substituted for C1, and therefore, the flow proceeds to Step S25.

[S25] The CPU $10a$ of the information processing system 10 performs a conversion class decision process for the variable C1. This process is identical with that executed in the aforementioned Step S22 and will be described in detail later with reference to FIG. 6.

In this example, "S" has been substituted for C1, and accordingly, the applicable conversion class is "Full-size Conversion", as in the above case.

[S26] The CPU $10a$ of the information processing system 10 determines whether or not the conversion classes and original codes of the characters stored in the variables C0 and C1 differ from each other. If the conversion classes and the original codes are different from each other, the flow proceeds to Step S27; if not, the flow proceeds to Step S29.

Namely, if the conversion classes and the original codes are different from each other, then it means that the characters stored in the variables C0 and C1 are of different character types; accordingly, it is Judged that the character stored in the variable C0 is the last character of a group of consecutive characters of the same character type, and the flow proceeds to Step S27. In the following, a group of consecutive characters of the same character type is called "chunk". In the aforementioned "ＳＳＮニュース", for example, "SSN" and "ニュース" are chunks.

[S27] The CPU $10a$ of the information processing system 10 determines whether or not the conversion class of the character substituted for the variable C1 is "Half-size Conversion" and at the same time the character type is half-size alphabetic character. If these apply to the character in question, the flow proceeds to Step S28; if not, the flow proceeds to Step S32.

Namely, if the conversion class of the character substituted for the variable C1 is "Half-size Conversion" and at the same time the character type is half-size alphabetic character, then the character in question is a half-size uppercase alphabetic character. In this case, the character is regarded as the first character of an English sentence, and the flow proceeds to Step S28.

[S28] The CPU $10a$ of the information processing system 10 selects "English Sentence Conversion" for the next chunk so that only the first character of the chunk may be capitalized at the time of restoration.

Namely, in the case of an English sentence, the first character of the sentence is capitalized. Accordingly, all of the characters are normalized to corresponding half-size lowercase alphabetic characters, and at the time of restoration, only the first character of the sentence is converted to a corresponding half-size uppercase alphabetic character, whereby English sentences can be efficiently processed without losing the information.

Selection of "English Sentence Conversion" for the next chunk may be made after confirming that the character following the one corresponding to the variable C1 is a half-size lowercase alphabetic character, and in this case it is possible to determine with higher reliability whether or not the characters concerned constitute an English sentence.

[S29] The CPU $10a$ of the information processing system 10 calculates the number of consecutive characters (or the number of consecutive bytes) up to the character stored in the variable C0, within the chunk to be processed.

In "ＳＳＮニュース", for example, provided the chunk to be processed is "ニュース" and the character stored in the variable C0 is "—", the number of consecutive characters is "3".

[S30] The CPU $10a$ of the information processing system 10 determines whether or not the number of consecutive characters or the number of consecutive bytes, calculated in Step S29, exceeds a predetermined maximum value. If the number of consecutive characters or bytes exceeds the maximum value, the flow proceeds to Step S32; if not, the flow proceeds to Step S31.

Since there is a limit on the number of characters that can be represented by a single conversion symbol, this process is performed so that the limit may not be exceeded. The number of consecutive bytes, for example, is represented by an ASCII character corresponding to the number of bytes, as described later, but the ASCII characters in a range of "0h" to "20h" and those beginning from "7Fh" are control characters which are not displayed on screen. In order to prevent overlapping with these ranges, therefore, an ASCII character corresponding to the sum of the number of consecutive bytes and "20h" is used, as described later, and the number of consecutive bytes is limited to a maximum of "94". The number of consecutive characters, on the other hand, is limited to "30" or less, for the reason mentioned later. Accordingly, when it is Judged in Step S30 that the number of consecutive bytes is equal to or larger than "95" bytes or the number of consecutive characters is equal to or larger than "31" characters, the flow proceeds to Step S32.

[S31] The CPU $10a$ of the information processing system 10 increments the value of the variable i by "1" and then returns to Step S21 to repeat the aforementioned process.

[S32] The CPU $10a$ of the information processing system 10 performs a process of generating restoration information which is used when restoring the normalized character string.

Details of the process will be described later with reference to FIG. 7.

[S33] The CPU $10a$ of the information processing system 10 determines whether or not the variable C1 is NULL (empty). If the variable is NULL, the original process is resumed; if not, the flow returns to Step S21 to repeat the aforementioned process.

Figure 6:
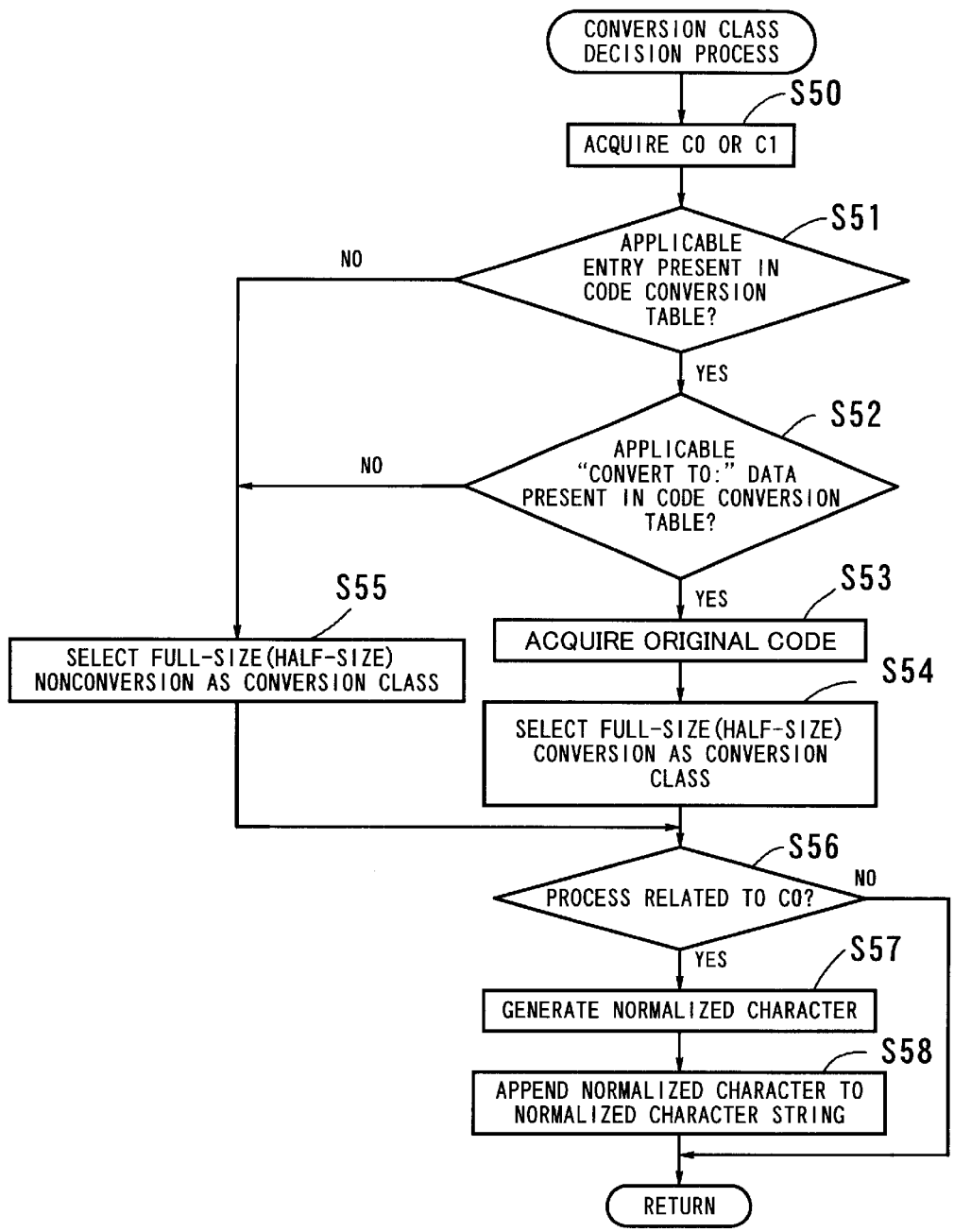
FIG. 6 is a flowchart illustrating details of a "CONVERSION CLASS DECISION PROCESS" appearing in Steps S22 and S25 in FIG. 4.

Referring now to FIG. 6, the process executed in Steps S22 and S25 in FIG. 4 will be described in detail. Upon start of the process shown in the flowchart, the following steps are executed.

[S50] The CPU $10a$ of the information processing system 10 acquires the character stored in the variable C0 or C1.

[S51] The CPU 10a of the information processing system 10 determines whether or not there exists an applicable character type in the ENTRY column of the code conversion table shown in FIG. 5. If such an applicable character type exists, the flow proceeds to Step S52; if not, the flow proceeds to Step S55.

Namely, if there is no applicable character type in the ENTRY column of the code conversion table, then the character in question is not a target of normalization, and in this case, Step S55 is executed.

[S52] The CPU 10a of the information processing system 10 checks the "CONVERT TO:" column of the code conversion table to determine whether or not an applicable character type (data other than "0") is defined. If such an applicable character type is defined, the flow proceeds to Step S53; if not, the flow proceeds to Step S55.

Namely, if "0" is set in the "CONVERT TO:" column, then the character in question need not be normalized, in which case the flow proceeds to Step S55.

[S53] The CPU 10a of the information processing system 10 looks up the code conversion table shown in FIG. 5, to acquire an applicable original code.

For example, if the character to be processed is the full-size uppercase alphabetic character "A", "02" is acquired as the original code.

[S54] The CPU 10a of the information processing system 10 selects Full-size or Half-size Conversion as the applicable conversion class.

For example, if the character to be processed is the aforementioned full-size uppercase alphabetic character "A", Full-size Conversion is selected as the applicable conversion class, and in the case of the half-size uppercase alphabetic character "F", Half-size Conversion is selected as the applicable conversion class.

[S55] The CPU 10a of the information processing system 10 selects Full-size or Half-size Nonconversion as the applicable conversion class.

For example, if the character to be processed is the full-size hiragana character "あ", Full-size Nonconversion is selected as the applicable conversion class, and in the case of the half-size lowercase alphabetic character "f", Half-size Nonconversion is selected as the applicable conversion class.

[S56] If the current cycle of the process is related to the variable C0, that is, if the current cycle is called from Step S22, the CPU 10a of the information processing system 10 executes Step S57; if not, the original process is resumed.

[S57] Looking up the code conversion table shown in FIG. 5, the CPU 10a of the information processing system 10 normalizes the character to be processed.

In the case where the character to be processed is the full-size katakana character "ア", for example, the code conversion table indicates that the character should be normalized to a full-size hiragana counterpart, and accordingly, "ア" is normalized "あ".

[S58] The CPU 10a of the information processing system 10 appends the normalized character generated in Step S57 to the normalized character string For example, if "ふろんてぃあ" has been stored as the normalized character string and the character obtained by the normalization in Step S57 is "あ", the normalized character string "ふろんてぃあ" is obtained in Step S58.

Figure 7:
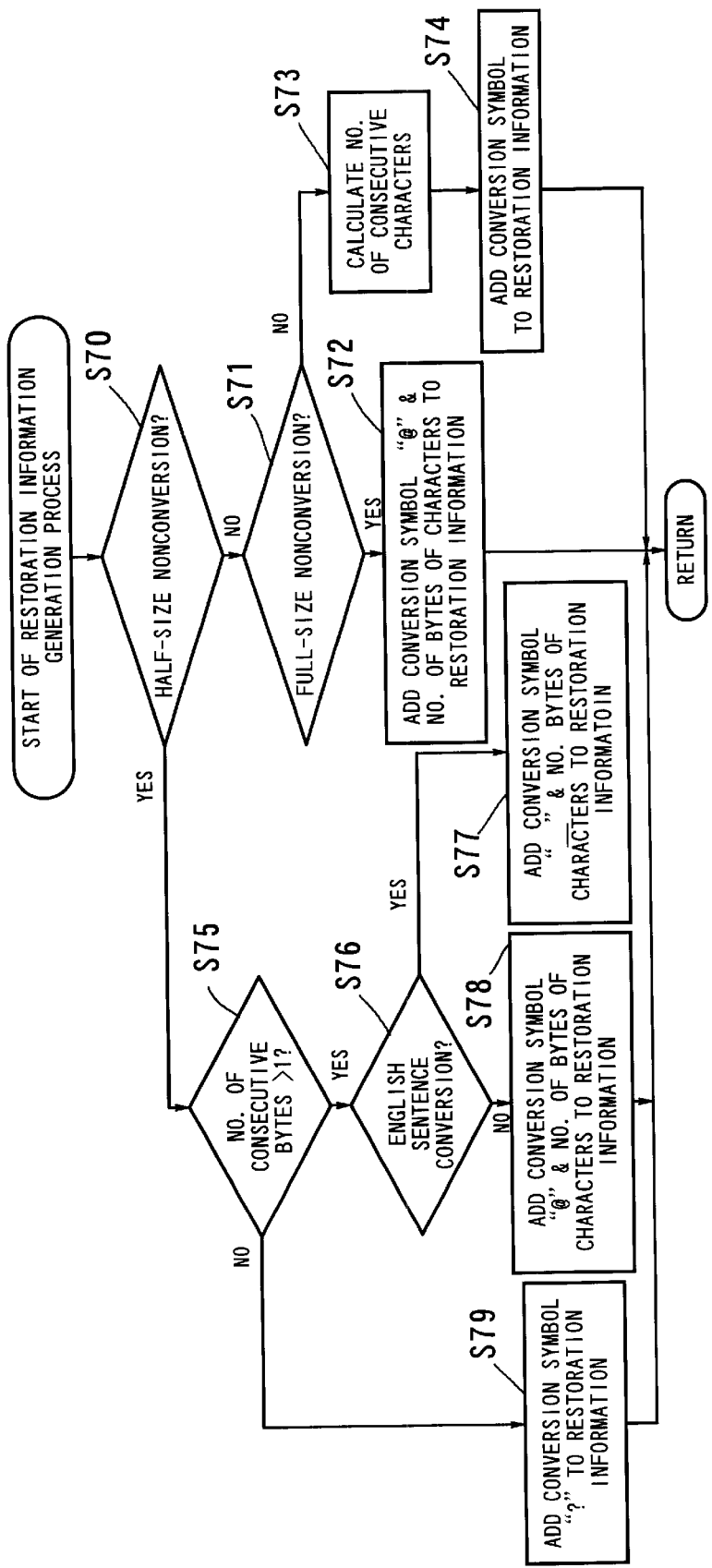
FIG. 7 is a flowchart illustrating details of a "RESTORATION INFORMATION GENERATION PROCESS" appearing in Step S32 in FIG. 4.

FIG. 7 is a flowchart illustrating details of the "RESTORATION INFORMATION GENERATION PROCESS" executed in Step S32 in FIG. 4 for generating restoration information in units of chunk. Prior to the explanation of the operation shown in the flowchart of FIG. 7, symbolic characters constituting the restoration information will be described with reference to FIG. 8.

FIG. 8 shows, by way of example, conversion symbols constituting the restoration information. In the figure, the first item "@○" consists of the half-size character "@" and a predetermined ASCII character (in this example, represented by "○"), and indicates that the number of bytes of characters corresponding to a value n obtained by subtracting "20h" from the ASCII code of the ASCII character should be restored by nonconversion. For example, in the case where the input character string includes the full-size hiragana characters "あした", the number of bytes of the consecutive characters is "6" bytes, and accordingly, the ASCII code "&" corresponding to the value "26h" obtained by adding "6" to "20h" is appended to "@", thereby generating the restoration information "@&". "20h" is added to the number of bytes so that the information may be converted to a displayable character, because the ASCII characters with codes equal to or smaller than "20h" are control characters which are often not displayed on screen.

The next item "_○" consists of the half-size character "_" and a predetermined ASCII character (in this example, represented by "○"), and indicates that the first lowercase alphabetic character alone should be capitalized and that the number of bytes of characters corresponding to (n−1), which is obtained by subtracting "1" from the value "n" obtained by subtracting "20h" from the ASCII code of the ASCII character, should be restored by nonconversion. For example, if the input character string is "that remains to be proved.", the ASCII character "." corresponding to the value "3Ah" obtained by adding the number of bytes of the character string, "26", to "20h" is appended to "_", thereby generating the restoration information.

The next item "?" is restoration information constituted by the half-size character "?" only, and indicates that 1 byte should be restored by nonconversion. For example, if the input character string is the half-size lowercase alphabetic character "a", "?" is generated as the restoration information.

The last item "◎" represents a predetermined ASCII character, the high-order 3 bits of its ASCII code indicating the original code and the low-order 5 bits indicating the number of characters. In the case where the input character string includes the full-size katakana characters "アスリート", for example, these characters are converted to the full-size hiragana characters "あすりーと" by the normalization. The applicable original code is "02", as seen from the code conversion table shown in FIG. 5, and the number of consecutive characters is "5"; therefore, the ASCII character "E" corresponding to "01000101" (=45h), which is a combination of "010" corresponding to the original code with "00101" corresponding to the number of consecutive characters, is generated as the restoration information. The number of consecutive characters is represented by 5 bits and thus the value that can be represented by 5 bits can theoretically be "0" through "31"; however, "0" is excluded because of lack of practicality and also "31" is excluded for the following reason. The ASCII codes of "_" and "?" are "5Fh" and "3Fh", respectively, and thus overlapping with these codes can be prevented by limiting the value that can be represented to a maximum of "30". This limitation is accomplished by the process executed in Step S30 shown in FIG. 4.

The operation illustrated in the flowchart of FIG. 7 will be now described. Upon start of the process shown in the flowchart, the following steps are executed.

[S70] If the conversion class of the chunk to be processed is Half-size Nonconversion, the CPU 10a of the information processing system 10 executes Step S75; if not, the flow proceeds to Step S71.

[S71] If the conversion class of the chunk to be processed is Full-size Nonconversion, the CPU 10a of the information processing system 10 executes Step S72; if not, the flow proceeds to Step S73.

[S72] The CPU 10a of the information processing system 10 adds the conversion symbol "@" and the number of bytes of the characters to the restoration information.

If the chunk to be processed is "ふろんてぃあ", for example, the restoration information is added with "@" and also with "," corresponding to the value "2Ch" obtained by adding the number of bytes of the characters, "12", to "20h".

[S73] The CPU 10a of the information processing system 10 calculates the number of consecutive characters, that is, the number of characters constituting the chunk.

[S74] The CPU 10a of the information processing system 10 adds, to the restoration information, the ASCII character corresponding to a value whose high-order 3 bits indicate the original code and whose low-order 5 bits indicate the number of consecutive characters calculated in Step S73.

For example, in the case where the chunk "フロンティア" has been normalized to ""ふろんてぃあ"", the original code is "02" and thus is "010" whereas the number of characters is "6" and thus is "00110". Since the combination of these values, "01000110", corresponds to "46h" in hexadecimal notation, its corresponding ASCII character "F" is added to the restoration information.

[S75] The CPU 10a of the information processing system 10 determines whether or not the number of consecutive bytes exceeds "1". If the number of consecutive bytes exceeds "1", the flow proceeds to Step S76; if not, the flow proceeds to Step S79.

[S76] The CPU 10a of the information processing system 10 determines whether or not English Sentence Conversion is applicable. Specifically, if English Sentence Conversion has been selected in Step S28 in FIG. 4, the flow proceeds to Step S77; if not, the flow proceeds to Step S78.

[S77] The CPU 10a of the information processing system 10 adds, to the restoration information, "_" indicating English Sentence Conversion, together with an ASCII character corresponding to the number of bytes of the characters.

For example, the chunk to be processed is "It can't be helped. ", the restoration information is added with "_" indicating English Sentence Conversion and also with the ASCII character "3" corresponding to the value "33h" obtained by adding the number of bytes of the characters, "19", to "20h".

[S78] The CPU 10a of the information processing system 10 adds, to the restoration information, the conversion symbol "@" together with an ASCII character indicating the number of bytes of the characters.

For example, if the chunk to be processed is "変換装置", the restoration information is added with all indicating nonconversion and also with the ASCII character "(" corresponding to the value "28h" obtained by adding the number of bytes of the characters, "8", to "20h".

[S79] The CPU 10a of the information processing system 10 adds the ASCII character "?" indicating 1-byte nonconversion to the restoration information.

If the chunk to be processed is "a", for example, the ASCII character "?" is added to the restoration information.

Referring now to FIGS. 9 through 12, specific examples of the aforementioned processes will be explained.

Figure 9:
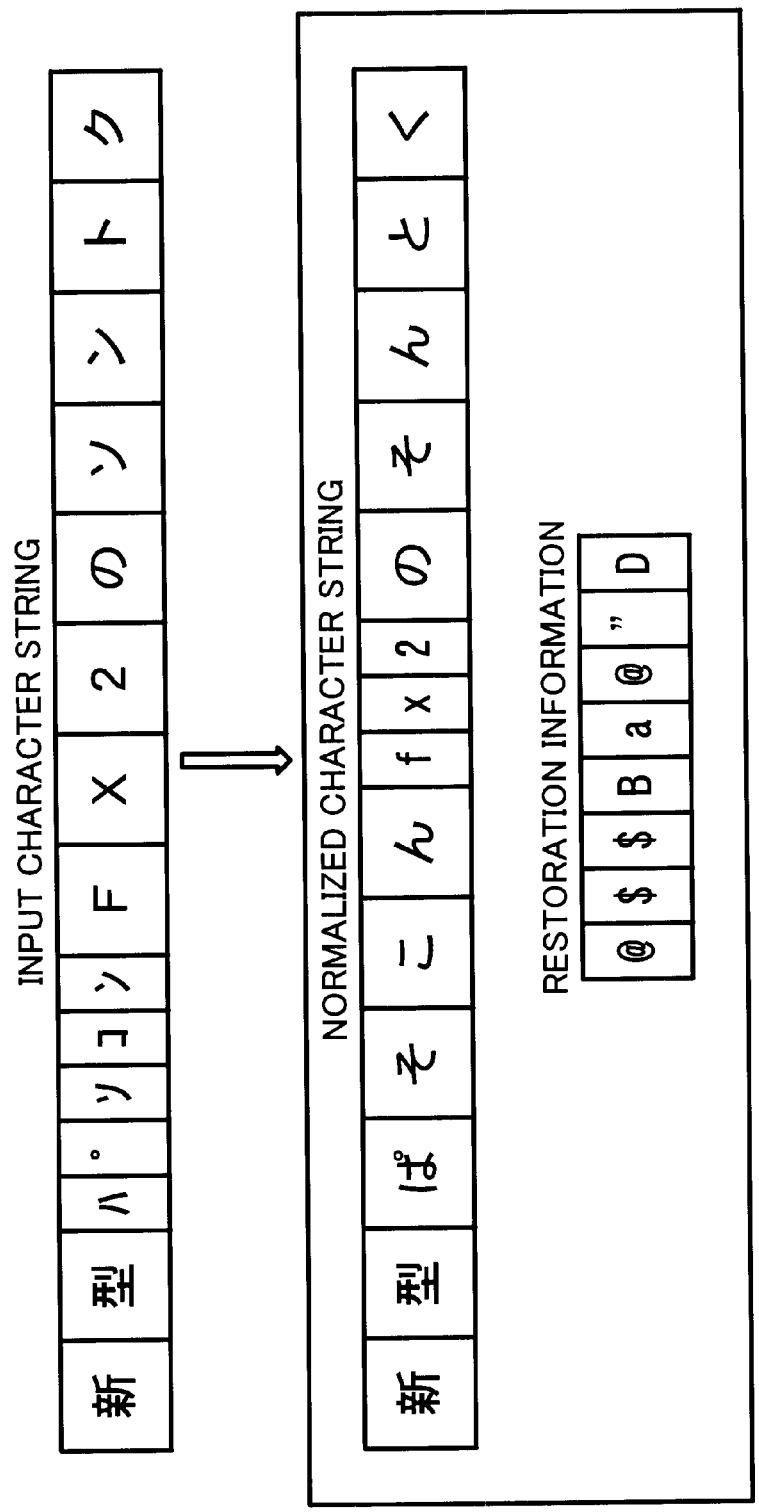
FIG. 9 is a diagram illustrating an example of a normalized character string and restoration information thereof generated according to the embodiment.

FIG. 9 shows, by way of example, a normalized character string and restoration information generated according to this embodiment.

In the illustrated example, the input character string is constituted by the full-size characters "新型", the half-size katakana characters "ﾊﾟｿｺﾝ", the full-size uppercase alphabetic characters "FX", the full-size numeric character "2", the full-size hiragana character ""第二版 誤植の訂正"", and the full-size katakana characters "ソントク". This input character string is subjected to the process shown in FIG. 4, and as a result, the first two full-size characters "新型" are left unconverted. Consequently, "@" indicating nonconversion and the ASCII character "$" corresponding to the value "24h" obtained by adding "20h" to the number of bytes of the consecutive characters, "4", are generated as the restoration information.

The succeeding half-size katakana characters "ﾊﾟｿｺﾝ" are converted to the full-size hiragana characters "ぱそこん". From FIG. 5, the applicable original code is found to be "01" and the number of characters after the conversion is "4"; therefore, the ASCII character "$" corresponding to the value obtained by combining "001" corresponding to the original code with "00100" corresponding to the number of converted characters is generated.

The succeeding full-size uppercase alphabetic characters "F X" are converted to the half-size lowercase alphabetic characters "fx". Since the applicable original code is "02" and the number of consecutive characters is "2", the ASCII character "B" corresponding to the value "42h" obtained based on these items of data is generated as the restoration information.

The next full-size numeric character "2" is converted to the half-size numeric character "2". The applicable original code is "03" and the number of characters is "1"; therefore, the ASCII character "a" corresponding to the value "61h" obtained based on these items of data is generated as the restoration information.

The succeeding full-size hiragana character ""の"" is left unconverted. Accordingly, restoration information is generated by appending, to "@" indicating nonconversion, the ASCII character """ corresponding to the value obtained by adding "20h" to the number of bytes, "2".

Finally, the full-size katakana characters "ソントク" are converted to the full-size hiragana characters "そんとく". Since the applicable original code is "02" and the number of characters is "4", the ASCII character "D" corresponding to the value "44h" obtained based on these items of data is generated as the restoration information.

In this example, therefore, the input character string is "25" bytes long while the restoration information is "8" bytes long, whereby the amount of information can be out down by 68%, compared with the conventional case in which the input character string is stored as it is.

Figure 10:
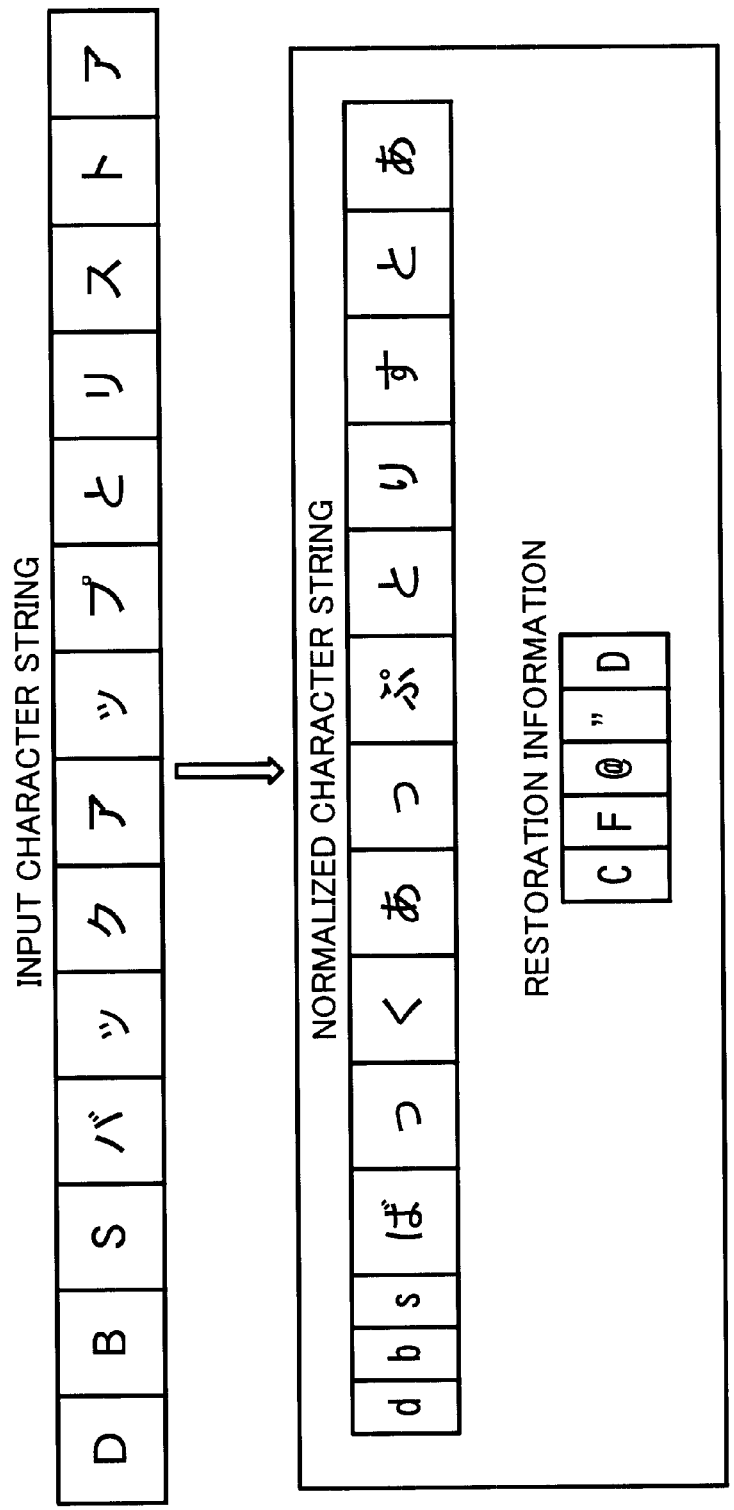
FIG. 10 is a diagram illustrating another example of a normalized character string and restoration information thereof generated according to the embodiment.

Referring now to FIG. 10, another example will be explained.

In this example, the input character string is constituted by the full-size uppercase alphabetic characters "D B S", the full-size katakana characters "バックアップ", the full-size hiragana character "と", and the full-size katakana characters "リストア".

The first three full-size uppercase alphabetic characters "D B S" are converted to the half-size lowercase alphabetic characters "dbs", and thus the corresponding restoration information is "C".

The succeeding full-size katakana characters "バックアップ" are converted to the full-size hiragana characters "ばっくあっぷ", and accordingly, the corresponding restoration information is "F".

The next full-size hiragana character "と" is left unconverted, and thus the restoration information is "@".

The last four full-size katakana characters "リストア" are converted to the full-size hiragana characters "りすとあ", and accordingly, the restoration information is "D".

Figure 11:
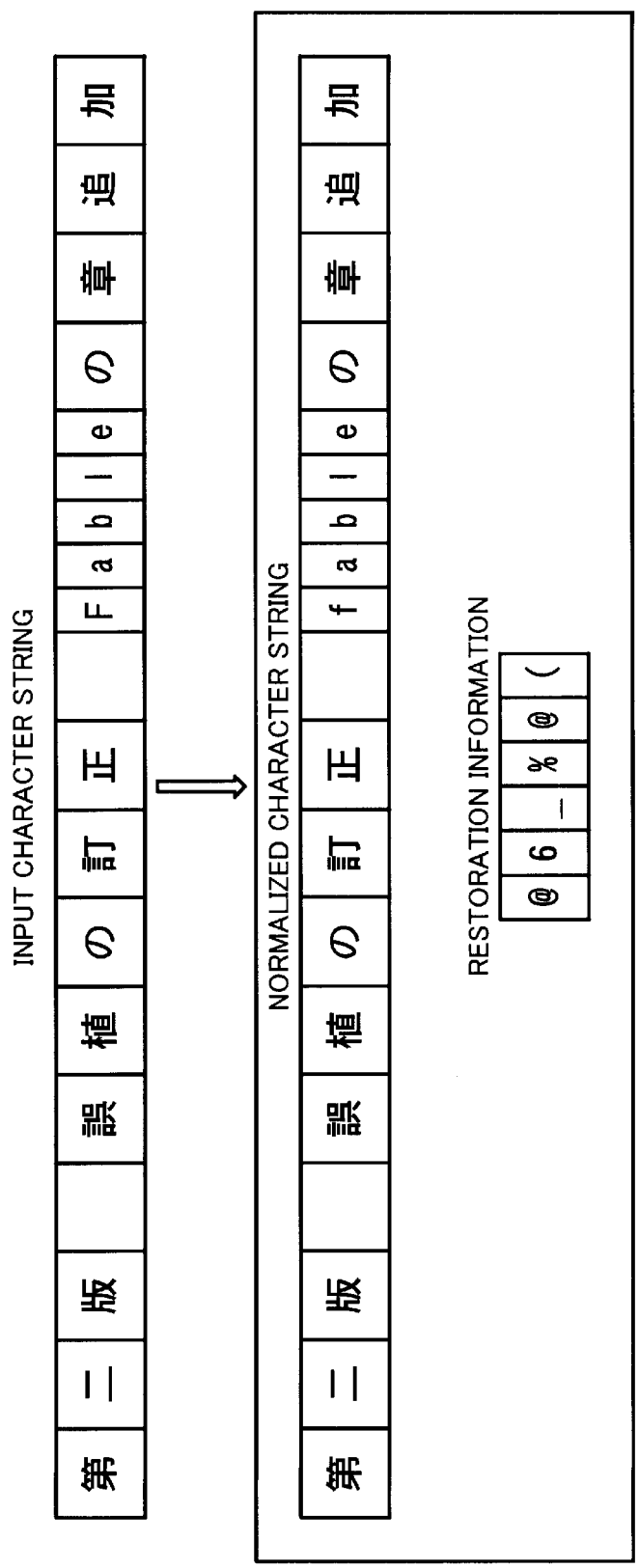
FIG. 11 is a diagram illustrating still another example of a normalized character string and restoration information thereof generated according to the embodiment.

Referring now to FIG. 11, still another example will be explained.

In this example, the input character string is constituted by the full-size characters "第二版 誤植の訂正", the half-size alphabetic characters "Fable", and the full-size characters "の章追加".

The full-size characters "第二版 誤植の訂正" are left unconverted, and thus the restoration information is "@6".

The succeeding half-size alphabetic characters "Fable" are converted to the half-size lowercase alphabetic characters "fable". Since the first character is a half-size uppercase alphabetic character, English Sentence Conversion is selected, and thus the restoration information is "%".

The last four full-size characters "の章追加" are left unconverted, and accordingly, the restoration information is "@(".

Figure 12:
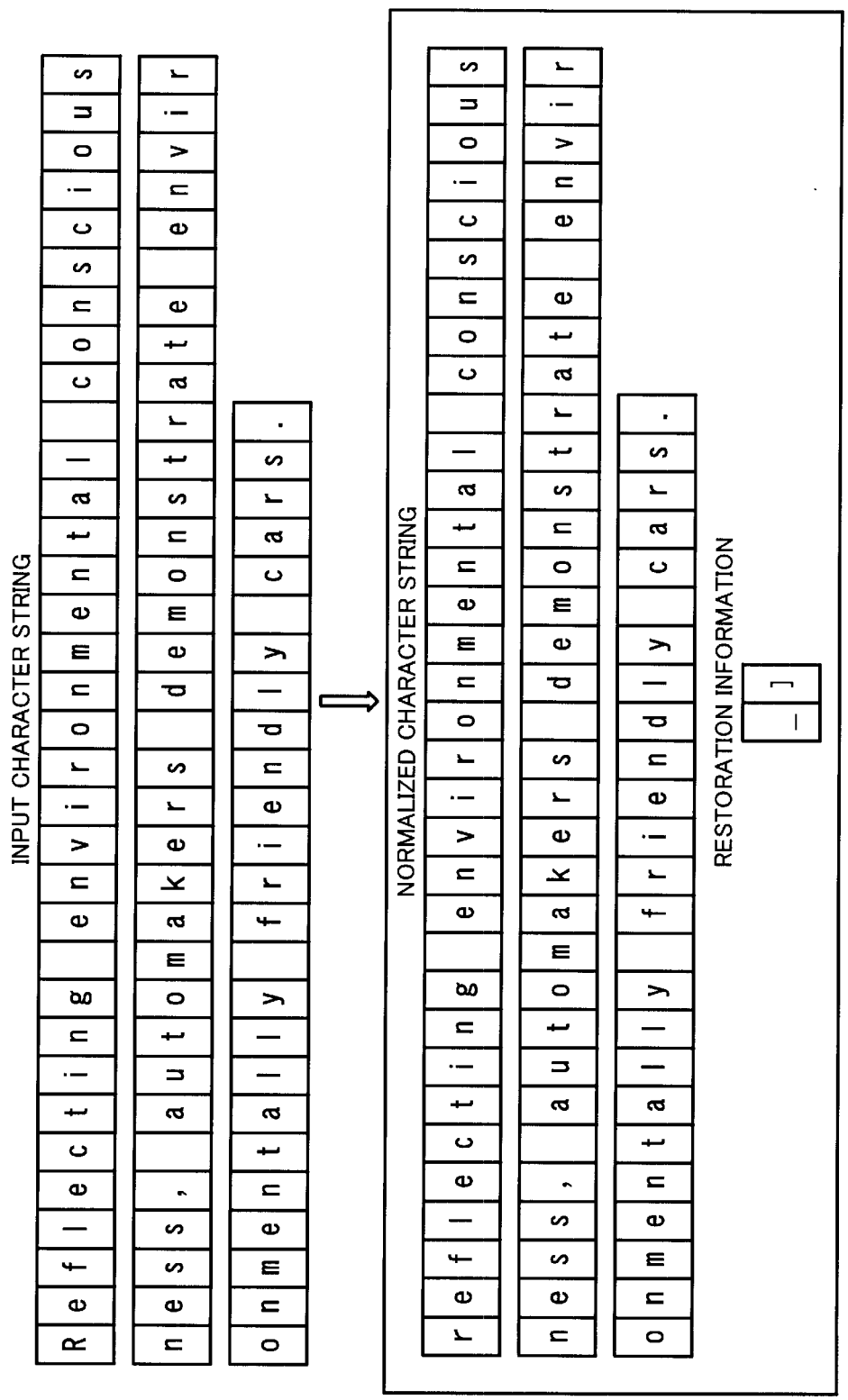
FIG. 12 is a diagram illustrating a further example of a normalized character string and restoration information thereof generated according to the embodiment.

A further example will be explained with reference to FIG. 12.

This example shows a case where all of the input character string is constituted by the half-size alphabetic characters "Reflecting environmental consciousness, automakers demonstrate environmentally friendly cars.". In this example, English Sentence Conversion is selected, and thus the restoration information is "_]".

Also, in this example, the input information is "93" bytes long while the restoration information is "2" bytes long, so that the amount of information can be cut down by about 98%.

The following describes a process of searching the normalized information generated in the manner described above and displaying search results.

Figure 13:
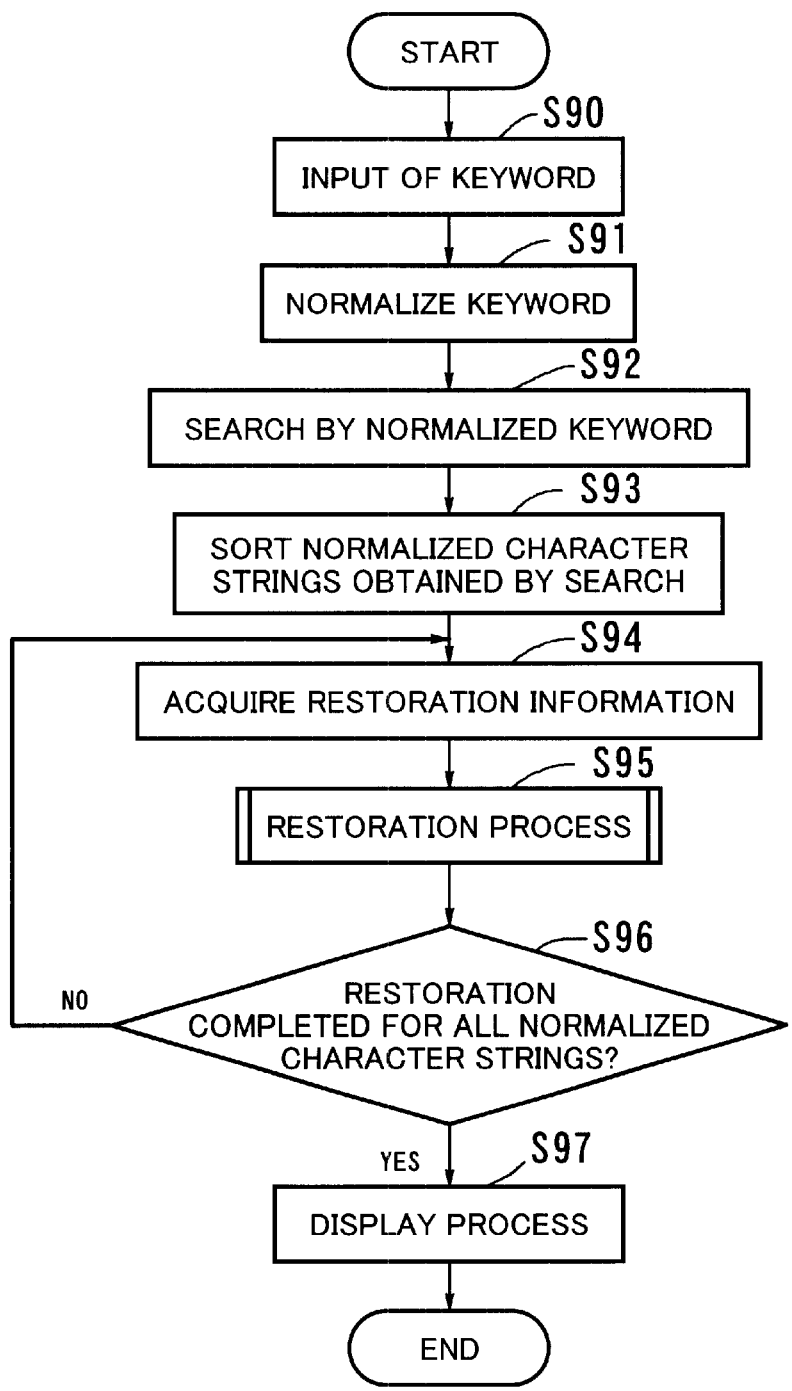
FIG. 13 is a flowchart illustrating an example of a retrieval process executed according to the embodiment shown in FIG. 2.

FIG. 13 is a flowchart showing an example of a process of searching data generated in the above-described manner and stored in the database 11. Upon start of the process shown in the flowchart, the following steps are executed.

[S90] The CPU 10a of the information processing system 10 is supplied with a keyword transmitted from the client 13.

[S91] Looking up the code conversion table shown in FIG. 5, the CPU 10a of the information processing system 10 normalizes the keyword.

[S92] Using the keyword thus normalized (hereinafter referred to as the normalized keyword), the CPU 10a of the information processing system 10 searches the database 11 and acquires applicable normalized character strings.

[S93] The CPU 10a of the information processing system 10 sorts the normalized character strings obtained as a result of the search.

This sorting process is performed with respect to the normalized character strings, and therefore, consistent results can always be obtained irrespective of the OS or the like of the information processing system 10.

[S94] The CPU 10a of the information processing system 10 acquires, from the database 11, the restoration information associated with the thus-sorted normalized character strings.

[S95] The CPU 10a of the information processing system 10 performs a restoration process for the normalized information.

Details of this process will be described later with reference to FIG. 14.

[S96] The CPU 10a of the information processing system 10 determines whether or not the restoration process for all of the normalized character strings has been completed. If the restoration process has been completed, the flow proceeds to Step S97; if not, the flow returns to Step S94 to repeat the aforementioned process.

[S97] The CPU 10a of the information processing system 10 performs a display process. Specifically, the information processing system 10 supplies the character strings thus restored (hereinafter referred to as the restored character strings) to the client 13 over the network 12 to be displayed at the display device 14.

Figure 14:
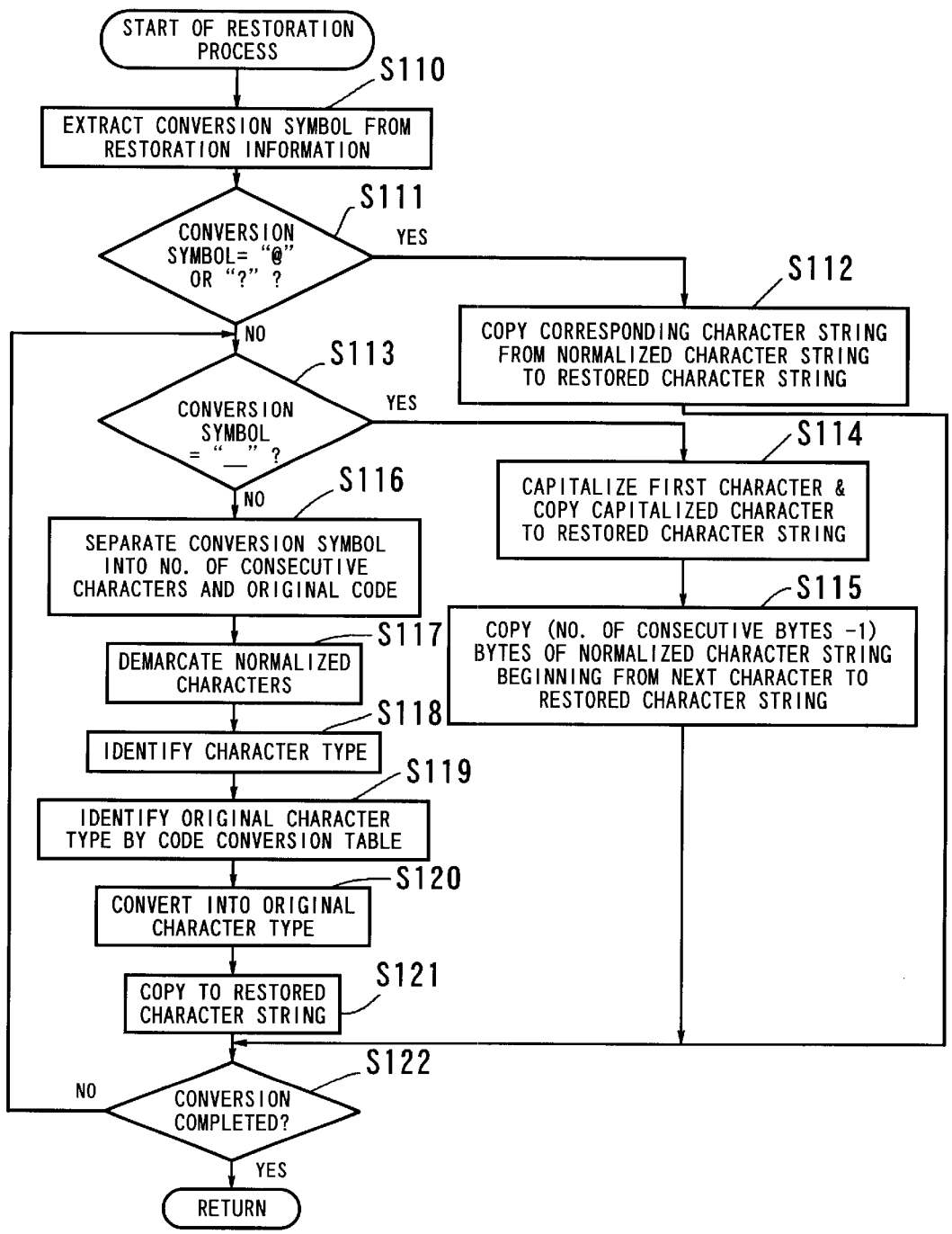
FIG. 14 is a flowchart illustrating details of a "RESTORATION PROCESS" appearing in FIG. 13.

Referring now to FIG. 14, the restoration process executed in Step S95 in FIG. 13 will be described in detail. Upon start of the process shown in the flowchart, the following steps are executed.

[S110] The CPU 10a of the information processing system 10 extracts one conversion symbol from the restoration information.

For example, if the restoration information is "@"?" and if the current cycle of process is the first cycle, the conversion symbol "@"" is extracted.

[S111] The CPU 10a of the information processing system 10 determines whether or not the extracted conversion symbol is identical with one of "@" and "?". If the conversion symbol to "@" or "?", the flow proceeds to Step S112; if not, the flow proceeds to Step S113.

[S112] The CPU 10a of the information processing system 10 copies a corresponding character string from the normalized character string to a restored character string.

For example, provided that the normalized character string being processed is "ぱそこん情報", that the currently restored character string is "ﾊﾟｿｺﾝ", and that the chunk to be processed is "情報", the corresponding character string in the normalized character string is copied to the restored character string, thus obataining "パソコン情報".

[S113] The CPU 10a of the information processing system 10 determines whether or not the extracted conversion symbol is "_". If the conversion symbol is "_", the flow proceeds to Step S114; if not, the flow proceeds to Step S116.

[S114] The CPU 10a of the information processing system 10 capitalizes the first character of the corresponding chunk in the normalized character string and copies the capitalized character to the restored character string.

For example, if the corresponding chunk in the normalized character string is "he is certain to succeed.", the initial character "h" is converted to the uppercase counterpart "H", which is then copied to the restored character string.

[S115] The CPU 10a of the information processing system 10 copies (the number of consecutive bytes–1) bytes of characters beginning from the next character of the normalized character string (the character following the initial character) to the restored character string.

In the above example, the restoration information Is "_9", and accordingly, the character string "e is certain to succeed." corresponding to the number of bytes obtained by subtracting "1" from the value "25" (=number of consecutive bytes) which is obtained by subtracting "20h" from "9" (="39h") is copied from the normalized character string to the restored character string. As a result, the restored character string becomes "He is certain to succeed.".

[S116] The CPU 10a of the information processing system 10 separates the conversion symbol into the number of consecutive characters and the original code.

Specifically, the conversion symbol is separated into the low-order 5 bits indicating the number of consecutive characters and the high-order 3 bits indicating the original code, or example, if the normalized character string is "ぱそこん" and the restoration information is "D", the restoration information "D" (="44h") is separated into the high-order 3 bits 010" and the low-order 5 bits "00100" in Step S116.

[S117] The CPU 10a of the information processing system 10 demarcates the chunk to be processed from the normalized character string.

Specifically, looking up the number of consecutive characters, the CPU 10a extracts the chunk to be processed from the normalized character string. In this example "ぱそこん" is extracted from the normalized character string.

[S118] The CPU 10a of the information processing system 10 identifies the character type of the chunk extracted in Step S117.

In this example, the character type of "ぱそこん" is identified as full-size hiragana.

[S119] Looking up the code conversion table, the CPU 10a of the information processing system 10 identifies the character type before the conversion.

In this example, the ENTRY column in FIG. 5 is looked up to search for the character type corresponding to "full-size hiragana" which is the character type of the normalized character string, and "full-size katakana" described in the ORIGINAL CODE 02 column is identified as the character type before the normalization.

[S120] The CPU 10a of the information processing system 10 converts the character string extracted in Step S117 into the original character type.

In this example "ぱそこん" is converted to "パソコン".

[S121] The CPU 10a of the information processing system 10 copies the thus-converted character string to the restored character string.

[S122] The CPU 10a of the information processing system 10 determines whether or not conversion of all characters in the normalized character string has been completed. If the conversion has been completed, the original process is resumed; if not, the flow returns to Step S110 and the aforementioned process is repeated.

According to the process described above, when data is to be registered in the database, a normalized character string obtained by normalizing an input character string and restoration information for restoring the original input character string from the normalized character string are registered in a manner associated with each other, and therefore, the required storage capacity can be cut down, compared with the case of storing the input character string.

Also, search and sorting are performed with respect to the normalized information, and after these processes are finished, original input character strings are restored by looking up the restoration information, whereby consistent search results can be derived irrespective of the system used.

In the description of the foregoing embodiment, the Shift-JIS code is taken as an example, but the present invention can be applied to other code systems.

The functions of the above-described processing can be implemented by a computer. In this case, the contents of the functions to be accomplished by the information processing system are described in a program recorded in a computer-readable recording medium. By executing the program by a computer, it is possible to perform the above-described process. The computer-readable recording medium includes a magnetic recording device, a semiconductor memory and the like. To distribute the program to the market, the program may be stored in portable recording media such as CD-ROM (Compact Disk Read Only Memory) or floppy disk. Alternatively, the program may be stored in the storage device of a computer connected to a network and may be transferred to other computers through the network. To execute the program by a computer, the program stored in a hard disk unit or the like of the computer is loaded into the main memory and executed.

As described above, according to the present invention, an information processing system for normalizing an input character string and storing a resulting character string comprises normalizing means for generating a normalized character string by normalizing an input character string, restoration information generating means for generating restoration information for restoring the normalized character string obtained by the normalizing means to an original character string, storing means for storing the restoration information generated by the restoration information generating means and the normalized character string in a manner associated with each other, and restoring means, responsive to specification of a certain normalized character string stored in the storing means, for restoring an original character string by looking up the corresponding restoration information, whereby the required storage capacity of the storing means can be out down, compared with the case of storing the input character strings.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An information processing system for normalizing an input character string and storing a resulting character string, comprising:

normalizing means for generating a normalized character string by normalizing the input character string;

restoration information generating means for generating restoration information for restoring the normalized character string obtained by said normalizing means to an original character string;

storing means for storing the restoration information generated by said restoration information generating means and the normalized character string in a manner associated with each other; and restoring means, responsive to specification of a certain normalized character string stored in said storing means, for restoring an original character string by looking up the corresponding restoration information;

wherein said normalizing means converts a group of consecutive characters of an identical character type included in the input character string to a group of characters of a predetermined character type; and further wherein said restoration information generating means generates, as the restoration information, information specifying character types before and after the normalization, and information specifying a number of characters in the group of consecutive characters of identical character type.

2. The information processing system according to claim 1, wherein if the character types before and after the normalization are identical and also if a number of bytes constituting the group of consecutive characters of identical character type is 1 byte, said restoration information generating means generates 1-byte information indicating that the character types before and after the normalization are identical and that the number of bytes constituting the group of consecutive characters of identical character type is 1 byte.

3. The information processing system according to claim 1, wherein if the character types before and after the normalization are identical and also if a number of bytes constituting the group of consecutive characters of identical character type is 2 bytes or more, said restoration information generating means generates 1-byte information indicating that the character types before and after the normalization are identical and that the number of bytes constituting the group of consecutive characters of identical character type is 2 bytes or more, and also generates 1-byte information indicating the number of characters in the group of consecutive characters.

4. The information processing system according to claim 1, wherein if the group of consecutive characters of identical character type are half-size alphabetic characters, said restoration information generating means generates predetermined restoration information indicating that the group of consecutive characters of identical character type are half-size alphabetic characters, and said restoring means converts, in response to the predetermined restoration information, a first character of the consecutive half-size alphabetic characters to a half-size uppercase alphabetic character.

5. The information processing system according to claim 1, further comprising display/output means for outputting the restoration information to a display device to be displayed thereat.

6. A computer-readable recording medium recording program for causing a computer to perform a process of normalizing an input character string and storing a resulting character string, wherein the program causes the computer to function as:

normalizing means for generating a normalized character string by normalizing the input character string, restoration information generating means for generating restoration information for restoring the normalized character string obtained by the normalizing means to an original character string, storing means for storing the restoration information generated by the restoration information generating means and the normalized character string in a manner associated with each other, and restoring means, responsive to specification of a certain normalized character string stored in the storing means, for restoring an original character string by looking up the corresponding restoration information, wherein said normalizing means converts a group of consecutive characters of an identical character type included in the input character string to a group of characters of a predetermined character type, and further wherein said restoration information generating means generates, as the restoration information, information specifying character types before and after the normalization, and information specifying a number of characters in the group of consecutive characters of identical character type.

* * * * *